US008796828B2

(12) United States Patent
Oganesian et al.

(10) Patent No.: US 8,796,828 B2
(45) Date of Patent: Aug. 5, 2014

(54) COMPLIANT INTERCONNECTS IN WAFERS

(71) Applicant: Tessera, Inc., San Jose, CA (US)

(72) Inventors: Vage Oganesian, Sunnyvale, CA (US);
Belgacem Haba, Saratoga, CA (US);
Ilyas Mohammed, Santa Clara, CA (US); Piyush Savalia, San Jose, CA (US); Craig Mitchell, San Jose, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 14/104,431

(22) Filed: Dec. 12, 2013

(65) Prior Publication Data
US 2014/0099754 A1 Apr. 10, 2014

Related U.S. Application Data

(62) Division of application No. 12/962,806, filed on Dec. 8, 2010, now Pat. No. 8,610,264.

(51) Int. Cl.
H01L 21/60 (2006.01)

(52) U.S. Cl.
USPC .... 257/667; 257/109; 257/612; 257/E23.015; 257/E23.067

(58) Field of Classification Search
CPC ........................................ H01L 25/074
USPC ................................. 257/E23.015
See application file for complete search history.

(56) References Cited

U.S. PATENT DOCUMENTS

| 4,074,342 A | 2/1978 | Honn et al. |
| 4,682,074 A | 7/1987 | Hoeberechts et al. |
| 4,765,864 A | 8/1988 | Holland et al. |
| 4,941,033 A | 7/1990 | Kishida |
| 5,148,265 A | 9/1992 | Khandros et al. |
| 5,148,266 A | 9/1992 | Khandros et al. |
| 5,229,647 A | 7/1993 | Gnadinger |
| 5,322,816 A | 6/1994 | Pinter |
| 5,334,561 A | 8/1994 | Matsui et al. |
| 5,347,159 A | 9/1994 | Khandros et al. |
| 5,481,133 A | 1/1996 | Hsu |
| 5,679,977 A | 10/1997 | Khandros et al. |
| 5,686,762 A | 11/1997 | Langley |

(Continued)

FOREIGN PATENT DOCUMENTS

| CN | 1490875 A | 4/2004 |
| CN | 1758430 A | 4/2006 |

(Continued)

OTHER PUBLICATIONS

U.S. Appl. No. 11/590,616, filed Oct. 31, 2006.

(Continued)

*Primary Examiner* — Stephen W Smoot
(74) *Attorney, Agent, or Firm* — Lerner, David, Littenberg, Krumholz & Mentlik, LLP

(57) ABSTRACT

A microelectronic assembly includes a substrate and an electrically conductive element. The substrate can have a CTE less than 10 ppm/° C., a major surface having a recess not extending through the substrate, and a material having a modulus of elasticity less than 10 GPa disposed within the recess. The electrically conductive element can include a joining portion overlying the recess and extending from an anchor portion supported by the substrate. The joining portion can be at least partially exposed at the major surface for connection to a component external to the microelectronic unit.

12 Claims, 5 Drawing Sheets

(56) References Cited

U.S. PATENT DOCUMENTS

| | | |
|---|---|---|
| 5,700,735 A | 12/1997 | Shiue et al. |
| 5,703,408 A | 12/1997 | Ming-Tsung et al. |
| 5,808,874 A | 9/1998 | Smith |
| 6,005,466 A | 12/1999 | Pedder |
| 6,013,948 A | 1/2000 | Akram et al. |
| 6,022,758 A | 2/2000 | Badehi |
| 6,031,274 A | 2/2000 | Muramatsu et al. |
| 6,037,668 A | 3/2000 | Cave et al. |
| 6,103,552 A | 8/2000 | Lin |
| 6,143,369 A | 11/2000 | Sugawa et al. |
| 6,143,396 A | 11/2000 | Saran et al. |
| 6,169,319 B1 | 1/2001 | Malinovich et al. |
| 6,181,016 B1 | 1/2001 | Lin et al. |
| 6,261,865 B1 | 7/2001 | Akram |
| 6,277,669 B1 | 8/2001 | Kung et al. |
| 6,284,563 B1 | 9/2001 | Fjelstad |
| 6,313,024 B1 | 11/2001 | Cave et al. |
| 6,313,540 B1 | 11/2001 | Kida et al. |
| 6,362,529 B1 | 3/2002 | Sumikawa et al. |
| 6,368,410 B1 | 4/2002 | Gorczyca et al. |
| 6,399,892 B1 | 6/2002 | Milkovich et al. |
| 6,472,247 B1 | 10/2002 | Andoh et al. |
| 6,492,201 B1 | 12/2002 | Haba |
| 6,498,381 B2 | 12/2002 | Halahan et al. |
| 6,498,387 B1 | 12/2002 | Yang |
| 6,507,113 B1 | 1/2003 | Fillion et al. |
| 6,586,955 B2 | 7/2003 | Fjelstad et al. |
| 6,608,377 B2 | 8/2003 | Chang et al. |
| 6,638,352 B2 | 10/2003 | Satsu et al. |
| 6,693,358 B2 | 2/2004 | Yamada et al. |
| 6,716,737 B2 | 4/2004 | Plas et al. |
| 6,727,576 B2 | 4/2004 | Hedler et al. |
| 6,737,300 B2 | 5/2004 | Ding et al. |
| 6,743,660 B2 | 6/2004 | Lee et al. |
| 6,812,549 B2 | 11/2004 | Umetsu et al. |
| 6,828,175 B2 | 12/2004 | Wood et al. |
| 6,864,172 B2 | 3/2005 | Noma et al. |
| 6,867,123 B2 | 3/2005 | Katagiri et al. |
| 6,873,054 B2 | 3/2005 | Miyazawa et al. |
| 6,879,049 B1 | 4/2005 | Yamamoto et al. |
| 6,914,336 B2 | 7/2005 | Matsuki et al. |
| 6,927,156 B2 | 8/2005 | Mathew |
| 6,982,475 B1 | 1/2006 | MacIntyre |
| 7,026,175 B2 | 4/2006 | Li et al. |
| 7,068,139 B2 | 6/2006 | Harris et al. |
| 7,091,062 B2 | 8/2006 | Geyer |
| 7,112,874 B2 | 9/2006 | Atlas |
| 7,271,033 B2 | 9/2007 | Lin et al. |
| 7,329,563 B2 | 2/2008 | Lo et al. |
| 7,413,929 B2 | 8/2008 | Lee et al. |
| 7,420,257 B2 | 9/2008 | Shibayama |
| 7,436,069 B2 | 10/2008 | Matsui |
| 7,446,036 B1 | 11/2008 | Bolom et al. |
| 7,456,479 B2 | 11/2008 | Lan |
| 7,531,445 B2 | 5/2009 | Shiv |
| 7,531,453 B2 | 5/2009 | Kirby et al. |
| 7,719,121 B2 | 5/2010 | Humpston et al. |
| 7,750,487 B2 | 7/2010 | Muthukumar et al. |
| 7,754,531 B2 | 7/2010 | Tay et al. |
| 7,767,497 B2 | 8/2010 | Haba |
| 7,781,781 B2 | 8/2010 | Adkisson et al. |
| 7,791,199 B2 | 9/2010 | Grinman et al. |
| 7,807,508 B2 | 10/2010 | Oganesian et al. |
| 7,829,976 B2 | 11/2010 | Kirby et al. |
| 7,901,989 B2 | 3/2011 | Haba et al. |
| 7,915,710 B2 | 3/2011 | Lee et al. |
| 7,935,568 B2 | 5/2011 | Oganesian et al. |
| 8,008,121 B2 | 8/2011 | Choi et al. |
| 8,008,192 B2 | 8/2011 | Sulfridge |
| 8,193,615 B2 | 6/2012 | Haba et al. |
| 8,253,244 B2 | 8/2012 | Kang |
| 8,263,434 B2 | 9/2012 | Pagaila et al. |
| 8,299,608 B2 | 10/2012 | Bartley et al. |
| 8,310,036 B2 | 11/2012 | Haba et al. |
| 8,405,196 B2 | 3/2013 | Haba et al. |
| 8,421,193 B2 | 4/2013 | Huang |
| 8,421,238 B2 | 4/2013 | Inagaki |
| 2001/0048591 A1 | 12/2001 | Fjelstad et al. |
| 2002/0061723 A1 | 5/2002 | Duescher |
| 2002/0096787 A1 | 7/2002 | Fjelstad |
| 2002/0109236 A1 | 8/2002 | Kim et al. |
| 2002/0151171 A1 | 10/2002 | Furusawa |
| 2003/0059976 A1 | 3/2003 | Nathan et al. |
| 2003/0071331 A1 | 4/2003 | Yamaguchi et al. |
| 2003/0178714 A1 | 9/2003 | Sakoda et al. |
| 2004/0016942 A1 | 1/2004 | Miyazawa et al. |
| 2004/0017012 A1 | 1/2004 | Yamada et al. |
| 2004/0043607 A1 | 3/2004 | Farnworth et al. |
| 2004/0051173 A1 | 3/2004 | Koh et al. |
| 2004/0061238 A1 | 4/2004 | Sekine |
| 2004/0104454 A1 | 6/2004 | Takaoka et al. |
| 2004/0155354 A1 | 8/2004 | Hanaoka et al. |
| 2004/0173891 A1 | 9/2004 | Imai et al. |
| 2004/0178495 A1 | 9/2004 | Yean et al. |
| 2004/0188819 A1 | 9/2004 | Farnworth et al. |
| 2004/0188822 A1 | 9/2004 | Hara |
| 2004/0217483 A1 | 11/2004 | Hedler et al. |
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0099259 A1 | 5/2005 | Harris et al. |
| 2005/0106845 A1 | 5/2005 | Halahan et al. |
| 2005/0148160 A1 | 7/2005 | Farnworth et al. |
| 2005/0156330 A1 | 7/2005 | Harris |
| 2005/0181540 A1 | 8/2005 | Farnworth et al. |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0055050 A1 | 3/2006 | Numata et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1 | 12/2006 | Gibson et al. |
| 2006/0292866 A1 | 12/2006 | Borwick et al. |
| 2007/0035020 A1 | 2/2007 | Umemoto |
| 2007/0045779 A1 | 3/2007 | Hiatt |
| 2007/0052050 A1 | 3/2007 | Dierickx |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1 | 11/2007 | Watkins et al. |
| 2007/0269931 A1 | 11/2007 | Chung et al. |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0076195 A1 | 3/2008 | Shiv |
| 2008/0079779 A1 | 4/2008 | Cornell et al. |
| 2008/0090333 A1 | 4/2008 | Haba et al. |
| 2008/0099900 A1 | 5/2008 | Oganesian et al. |

(56) References Cited

U.S. PATENT DOCUMENTS

| | | |
|---|---|---|
| 2008/0099907 A1 | 5/2008 | Oganesian et al. |
| 2008/0111213 A1 | 5/2008 | Akram et al. |
| 2008/0116544 A1 | 5/2008 | Grinman et al. |
| 2008/0136038 A1 | 6/2008 | Savastiouk et al. |
| 2008/0150089 A1 | 6/2008 | Kwon et al. |
| 2008/0157273 A1 | 7/2008 | Giraudin et al. |
| 2008/0164574 A1 | 7/2008 | Savastiouk et al. |
| 2008/0185719 A1 | 8/2008 | Cablao et al. |
| 2008/0230923 A1 | 9/2008 | Jo et al. |
| 2008/0246136 A1 | 10/2008 | Haba et al. |
| 2008/0274589 A1 | 11/2008 | Lee et al. |
| 2008/0284041 A1 | 11/2008 | Jang et al. |
| 2009/0008747 A1 | 1/2009 | Hoshino et al. |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0108464 A1 | 4/2009 | Uchiyama |
| 2009/0133254 A1 | 5/2009 | Kubota et al. |
| 2009/0134498 A1 | 5/2009 | Ikeda et al. |
| 2009/0148591 A1 | 6/2009 | Wang et al. |
| 2009/0212381 A1 | 8/2009 | Crisp et al. |
| 2009/0224372 A1 | 9/2009 | Johnson |
| 2009/0243047 A1 | 10/2009 | Wolter et al. |
| 2009/0263214 A1 | 10/2009 | Lee et al. |
| 2009/0267183 A1 | 10/2009 | Temple et al. |
| 2009/0267194 A1 | 10/2009 | Chen |
| 2009/0283662 A1 | 11/2009 | Wu et al. |
| 2009/0294983 A1 | 12/2009 | Cobbley et al. |
| 2009/0309235 A1 | 12/2009 | Suthiwongsunthorn et al. |
| 2010/0013060 A1 | 1/2010 | Lamy et al. |
| 2010/0038778 A1 | 2/2010 | Lee et al. |
| 2010/0105169 A1 | 4/2010 | Lee et al. |
| 2010/0117242 A1 | 5/2010 | Miller et al. |
| 2010/0127346 A1 | 5/2010 | DeNatale et al. |
| 2010/0148371 A1 | 6/2010 | Kaskoun et al. |
| 2010/0155940 A1 | 6/2010 | Kawashita et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1 | 9/2010 | Kriman et al. |
| 2010/0258917 A1 | 10/2010 | Lin |
| 2011/0089573 A1 | 4/2011 | Kurita |
| 2011/0266674 A1 | 11/2011 | Hsia et al. |
| 2012/0007232 A1 | 1/2012 | Haba |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0020026 A1 | 1/2012 | Oganesian et al. |
| 2012/0025365 A1 | 2/2012 | Haba |
| 2012/0068330 A1 | 3/2012 | Oganesian et al. |
| 2012/0068352 A1 | 3/2012 | Oganesian et al. |

FOREIGN PATENT DOCUMENTS

| | | | |
|---|---|---|---|
| CN | 101675516 | A | 3/2010 |
| CN | 201910420 | U | 7/2011 |
| EP | 0316799 | A1 | 5/1989 |
| EP | 0926723 | A1 | 6/1999 |
| EP | 1482553 | A2 | 12/2004 |
| EP | 1519410 | A1 | 3/2005 |
| EP | 1551060 | A1 | 7/2005 |
| EP | 1619722 | A1 | 1/2006 |
| EP | 1653510 | A2 | 5/2006 |
| EP | 1653521 | A1 | 5/2006 |
| EP | 1686627 | A1 | 8/2006 |
| JP | 60160645 | A | 8/1985 |
| JP | 1106949 | A | 4/1989 |
| JP | 4365558 | A | 12/1992 |
| JP | 08-213427 | A | 8/1996 |
| JP | 11016949 | A | 1/1999 |
| JP | 11195706 | A | 7/1999 |
| JP | 2001085559 | A | 3/2001 |
| JP | 2001-217386 | A | 8/2001 |
| JP | 2002016178 | A | 1/2002 |
| JP | 2002162212 | A | 6/2002 |
| JP | 2002217331 | A | 8/2002 |
| JP | 2002373957 | A | 12/2002 |
| JP | 2003318178 | A | 11/2003 |
| JP | 2004165602 | A | 6/2004 |
| JP | 2004200547 | A | 7/2004 |
| JP | 2005026405 | A | 1/2005 |
| JP | 2005093486 | A | 4/2005 |
| JP | 2005101268 | A | 4/2005 |
| JP | 2005209967 | A | 8/2005 |
| JP | 2005216921 | A | 8/2005 |
| JP | 2007053149 | A | 3/2007 |
| JP | 2007157844 | A | 6/2007 |
| JP | 2007317887 | A | 12/2007 |
| JP | 2008-091632 | A | 4/2008 |
| JP | 2008-177249 | A | 7/2008 |
| JP | 2008227335 | A | 9/2008 |
| JP | 2008-258258 | A | 10/2008 |
| JP | 2010-028601 | A | 2/2010 |
| KR | 19990088037 | | 12/1999 |
| KR | 20040066018 | A | 7/2004 |
| KR | 20060009407 | A | 1/2006 |
| KR | 2006-0020822 | A | 3/2006 |
| KR | 20070065241 | A | 6/2007 |
| KR | 100750741 | B1 | 8/2007 |
| KR | 20100087566 | A | 8/2010 |
| TW | 200406884 | A | 5/2004 |
| TW | 200522274 | A | 7/2005 |
| TW | 200535435 | A | 11/2005 |
| TW | 201025501 | A | 7/2010 |
| WO | 03/025998 | A2 | 3/2003 |
| WO | 2004114397 | | 12/2004 |
| WO | 2008/054660 | A2 | 5/2008 |
| WO | 2008108970 | A2 | 9/2008 |
| WO | 2009017758 | A2 | 2/2009 |
| WO | 2009023462 | A1 | 2/2009 |
| WO | 2009104668 | A1 | 8/2009 |
| WO | 2010104637 | A1 | 9/2010 |

OTHER PUBLICATIONS

U.S. Appl. No. 11/789,694, filed Apr. 25, 2007.
U.S. Appl. No. 12/143,743, "Reconstituted Wafer Level Stacking", filed Jun. 20, 2008.
Chinese Office Action for Application No. 201010546210.2 dated Aug. 21, 2013.
Chinese Office Action for Application No. 201010546793.9 dated Jun. 25, 2013.
Japanese Office Action for Application No. 2009-552696 dated Nov. 1, 2013.
Preliminary Examination Report from Taiwan Application No. 099140226 dated Oct. 21, 2013.
Taiwanese Office Action for Application No. 099143374 dated Jun. 24, 2013.
Taiwanese Office Action for Application No. 100133520 dated Dec. 12, 2013.
U.S. Appl. No. 12/723,039, filed Mar. 12, 2010.
U.S. Appl. No. 12/784,841, filed May 21, 2010.
U.S. Appl. No. 12/842,612, filed Jul. 23, 2010.
U.S. Appl. No. 12/842,651, filed Jul. 23, 2010.
U.S. Appl. No. 12/842,717, filed Jul. 23, 2010.
David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.
International Search Report and Written Opinion for Application No. PCT/US2011/029394 dated Jun. 6, 2012.
International Search Report and Written Opinion for Application No. PCT/US2011/060553 dated Oct. 26, 2012.

(56) References Cited

OTHER PUBLICATIONS

International Search Report and Written Opinion for Application No. PCT/US2011/063653 dated Aug. 13, 2012.
International Search Report and Written Opinion for PCT/US2011/051552 dated Apr. 11, 2012.
International Search Report and Written Opinion for PCT/US2011/051556 dated Feb. 13, 2012.
International Search Report and Written Opinion, PCT/US2008/009356 dated Feb. 19, 2009.
International Search Report and Written Opinion, PCT/US2010/002318, dated Nov. 22, 2010.
International Search Report and Written Opinion, PCT/US2010/052458, dated Jan. 31, 2011.
International Search Report and Written Opinion, PCT/US2010/052785, Dated Dec. 20, 2010.
International Search Report and Written Opinion, PCT/US2011/063025, Mar. 19, 2012.
International Search Report Application No. PCT/US2011/029568, dated Aug. 30, 2011.
International Search Report Application No. PCT/US2011/029568, dated Oct. 21, 2011.
International Search Report, PCT/US10/52783, Dated Dec. 10, 2010.
International Search Report, PCT/US2008/002659, Oct. 17, 2008.
International Searching Authority, Search Report for Application No. PCT/US2011/060553 dated Jun. 27, 2012.
International Written Opinion for Application No. PCT/US2011/063653 dated Jan. 14, 2013.
Japanese Office Action for Application No. 2009-552696 dated Aug. 14, 2012.
Japanese Office Action for Application No. 2010-519953 dated Oct. 19, 2012.
Partial International Search Report for Application No. PCT/US2011/063653 dated Jul. 9, 2012.
Partial International Search Report, PCT/US2008/002659.
PCT/US08/09207, "Reconstituted Wafer Stack Packaging With After Applied Pad Extensions," filed Jul. 25, 2008.
Supplementary European Search Report, EP 08795005 dated Jul. 5, 2010.
Taiwan Office Action for Application No. 100113585 dated Jun. 5, 2012.

COMPLIANT INTERCONNECTS IN WAFERS

CROSS-REFERENCE TO RELATED APPLICATION

The present application is a divisional of U.S. patent application Ser. No. 12/962,806, filed Dec. 8, 2010, the disclosure of which is incorporated herein by reference.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a front surface having contacts connected to the active circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front surface, the "area of the chip" should be understood as referring to the area of the front surface.

In "flip chip" designs, the front surface of the chip confronts a surface of a package substrate, i.e., a chip carrier, and the contacts on the chip are bonded directly to contacts of the chip carrier by solder balls or other connecting elements. In turn, the chip carrier can be bonded to a circuit panel through terminals overlying the front surface of the chip. The "flip chip" design provides a relatively compact arrangement; each chip occupies an area of the circuit panel equal to or slightly larger than the area of the chip's front surface, such as disclosed, for example, in certain embodiments of commonly-assigned U.S. Pat. Nos. 5,148,265, 5,148,266, and 5,679,977, the disclosures of which are incorporated herein by reference.

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel.

It has also been proposed to package plural chips in a "stacked" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,148,265, 5,679,977, and U.S. Pat. No. 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Conventional chip contacts may have reliability challenges because of a non-optimal stress distribution at the contact and a mismatch of the coefficient of thermal expansion (CTE) between a semiconductor chip, for example, and the structure to which the chip is bonded. For example, when conductive contacts at a surface of a semiconductor chip are insulated by a relatively thin and stiff dielectric material, significant stresses may be present at the contacts. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor contact formation and interconnection, there is still a need for improvements in order to minimize the size of semiconductor chips, while enhancing electrical interconnection reliability. These attributes of the present invention are achieved by the construction of the microelectronic packages as described hereinafter.

BRIEF SUMMARY OF THE INVENTION

In accordance with an aspect of the invention, a microelectronic assembly can include a substrate and an electrically conductive element. The substrate can have a CTE less than 10 ppm/° C., a major surface having a recess not extending through the substrate, and a material having a modulus of elasticity less than 10 GPa disposed within the recess. The electrically conductive element can include a joining portion overlying the recess and extending from an anchor portion supported by the substrate. The joining portion can be at least partially exposed at the major surface for connection to a component external to the microelectronic unit.

In one embodiment, the substrate can have a CTE less than 7 ppm/° C. In a particular embodiment, the joining portion can be movable so as to reduce stresses on the joining portion, such as may be present during operation, manufacturing, or testing of the microelectronic unit. In an exemplary embodiment, the substrate can consist essentially of one material selected from the group consisting of: semiconductor, glass, and ceramic. In one embodiment, the substrate can include a plurality of active semiconductor devices and the conductive element can be electrically connected with at least one of the plurality of active semiconductor devices. In a particular embodiment, the material disposed within the recess can include at least one material selected from the group consisting of: polyimide, silicone, and epoxy.

In an exemplary embodiment, the recess may not extend through the substrate. In one embodiment, the joining portion can extend in a direction substantially parallel to the major surface of the substrate. In a particular embodiment, the anchor portion and the joining portion can extend in the same direction. In an exemplary embodiment, the conductive element can be electrically coupled with a conductive via extending towards a second surface of the substrate opposite the major surface. In one embodiment, the conductive via can be exposed at the second surface. In a particular embodiment, the conductive via can extend within a hole in the substrate extending from the second surface to the major surface.

In one embodiment, the hole can include a first opening extending from the major surface towards the second surface and a second opening extending from the first opening to the second surface. Inner surfaces of the first and second openings can extend in first and second directions relative to the major surface, respectively, to define a substantial angle. In an exemplary embodiment, a stacked assembly can include at least first and second microelectronic units, the second microelectronic unit being stacked with the first microelectronic unit, with the substrate of the first microelectronic unit therein being electrically connected with a substrate of the second microelectronic unit. In a particular embodiment, the stacked assembly can further include a conductive mass electrically coupled to the joining portion of the first microelectronic unit and a conductive element of the second microelectronic unit.

In accordance with another aspect of the invention, a microelectronic assembly can include a substrate and an electrically conductive element. The substrate can have a CTE less than 10 ppm/° C., a major surface having a recess not extending through the substrate, and a material having a modulus of elasticity less than 10 GPa disposed within the recess. The electrically conductive element can have an anchor portion fixed relative to the substrate, a joining portion at least partially overlying the recess, and a connecting portion extending downwardly from the joining portion to the anchor portion. The joining portion can extend in a direction away from the anchor portion and can be exposed at the major surface for connection to a component external to the microelectronic unit. The connecting portion can have a contour not conforming to a contour of an inner surface of the recess.

In an exemplary embodiment, the substrate can have a CTE less than 7 ppm/° C. In one embodiment, the joining portion can be movable so as to reduce stresses on the joining portion, such as may be present during operation, manufacturing, or testing of the microelectronic unit. In a particular embodiment, the substrate can consist essentially of one material selected from the group consisting of: semiconductor, glass, and ceramic. In one embodiment, the substrate can include a plurality of active semiconductor devices and the conductive element can be electrically connected with at least one of the plurality of active semiconductor devices. In an exemplary embodiment, the connecting portion can extend into the recess.

In a particular embodiment, the conductive element can be electrically coupled with a conductive via extending towards a second surface of the substrate opposite the major surface. In one embodiment, the conductive via can be exposed at the second surface. In an exemplary embodiment, the conductive via can extend within a hole in the substrate extending from the second surface to the major surface. In a particular embodiment, the hole can include a first opening extending from the major surface towards the second surface and a second opening extending from the first opening to the second surface. Inner surfaces of the first and second openings can extend in first and second directions relative to the major surface, respectively, to define a substantial angle. In one embodiment, the anchor portion can have a contour conforming to a contour of an inner surface of the hole. In an exemplary embodiment, the joining portion can define an internal aperture.

In one embodiment, the aperture can extend through the joining portion into the connecting portion. In a particular embodiment, at least a portion of the aperture can be filled with a dielectric material. In an exemplary embodiment, a stacked assembly can include at least first and second microelectronic units, the second microelectronic unit being stacked with the first microelectronic unit, with the substrate of the first microelectronic unit therein being electrically connected with a substrate of the second microelectronic unit. In a particular embodiment, the stacked assembly can further include a conductive mass electrically coupled to the joining portion of the first microelectronic unit and a conductive element of the second microelectronic unit.

In accordance with yet another aspect of the invention, a method of fabricating a microelectronic unit can include the steps of forming an electrically conductive element supported on a major surface of a substrate having a CTE less than 10 ppm/° C., removing material supporting at least a joining portion of the conductive element from the major surface to form a recess not extending through the substrate, and depositing a material within the recess having a modulus of elasticity less than 10 GPa. The joining portion may not be supported by the substrate while an anchor portion of the conductive element adjacent the joining portion may be supported by the substrate. The joining portion can be at least partially exposed at the major surface of the substrate for connection to a component external to the microelectronic unit.

In one embodiment, the substrate can have a CTE less than 7 ppm/° C. In an exemplary embodiment, the substrate can consist essentially of one material selected from the group consisting of: semiconductor, glass, and ceramic. In a particular embodiment, the substrate can include a plurality of active semiconductor devices, and the step of forming the conductive element can electrically connect the conductive element with at least one of the plurality of active semiconductor devices. In an exemplary embodiment, the step of forming the conductive element can be performed such that the joining portion is disposed substantially parallel to the major surface. In one embodiment, the method can further include the steps of removing material from the substrate to form a hole extending from the major surface to a second surface of the substrate opposite the major surface, and forming a conductive via extending within the hole such that the conductive via is electrically coupled with the conductive element and extends towards the second surface.

In a particular embodiment, the step of removing material from the substrate to form a hole can include forming a first opening extending from the major surface towards the second surface and a second opening extending from the first opening to the second surface. The inner surfaces of the first and second openings can extend in first and second directions relative to the major surface, respectively, to define a substantial angle. In one embodiment, a method of fabricating a stacked assembly including at least first and second microelectronic units can further include the step of electrically connecting the substrate of the first microelectronic unit to a substrate of the second microelectronic unit.

In accordance with still another aspect of the invention, a method of fabricating a microelectronic unit can include the steps of removing material from a substrate having a CTE less than 10 ppm/° C. to form a hole extending from a major surface of the substrate to a second surface opposite the major surface, forming an electrically conductive element having a joining portion extending above and supported on the major surface, an anchor portion fixed relative to the substrate, and a connecting portion extending downwardly from the joining portion to the anchor portion, removing material supporting at least a joining portion of the conductive element from the major surface to form a recess such that the joining portion at least partially overlies the recess, and depositing a material within the recess having a modulus of elasticity less than 10 GPa. A surface of the connecting portion can have a contour conforming to a contour of an inner surface of the hole. The contour of the surface of the connecting portion may not conform to a contour of an inner surface of the recess. The joining portion can be at least partially exposed at the major surface of the substrate for connection to a component external to the microelectronic unit.

In a particular embodiment, the substrate can have a CTE less than 7 ppm/° C. In an exemplary embodiment, the method of fabricating a microelectronic unit can further include, before the step of forming the conductive element, forming a conductive via extending within the hole and extending towards the second surface, such that the step of forming the conductive element electrically couples the conductive element with the conductive via. In one embodiment, the step of forming the conductive element can be performed such that the joining portion is non-centered relative to the connecting portion. In a particular embodiment, the substrate can consist essentially of one material selected from the group consisting of: semiconductor, glass, and ceramic. In an exemplary embodiment, the substrate can includes a plurality of active semiconductor devices, and the step of forming the conductive element can electrically connect the conductive element with at least one of the plurality of active semiconductor devices. In one embodiment, the step of forming the conductive element can be performed such that the joining portion defines an internal aperture. In a particular embodiment, the step of forming the conductive element can be performed such that the aperture extends through the joining portion into the connecting portion.

In one embodiment, the method of fabricating a microelectronic unit can further include the step of depositing a dielectric material into at least a portion of the aperture. In a particular embodiment, the step of removing material from the substrate to form a hole can include forming a first opening extending from the major surface towards the second surface and a second opening extending from the first opening to the second surface. The inner surfaces of the first and second openings can extend in first and second directions relative to the major surface, respectively, to define a substantial angle. In an exemplary embodiment, a method of fabricating a stacked assembly including at least first and second microelectronic units can further include the step of electrically connecting the substrate of the first microelectronic unit to a substrate of the second microelectronic unit.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

Further aspects of the invention provide modules that can include a plurality of microelectronic assemblies according to the foregoing aspects of the invention. Each module can have a common electrical interface for transport of signals to and from each of said microelectronic assemblies.

DETAILED DESCRIPTION

Figure 1A:
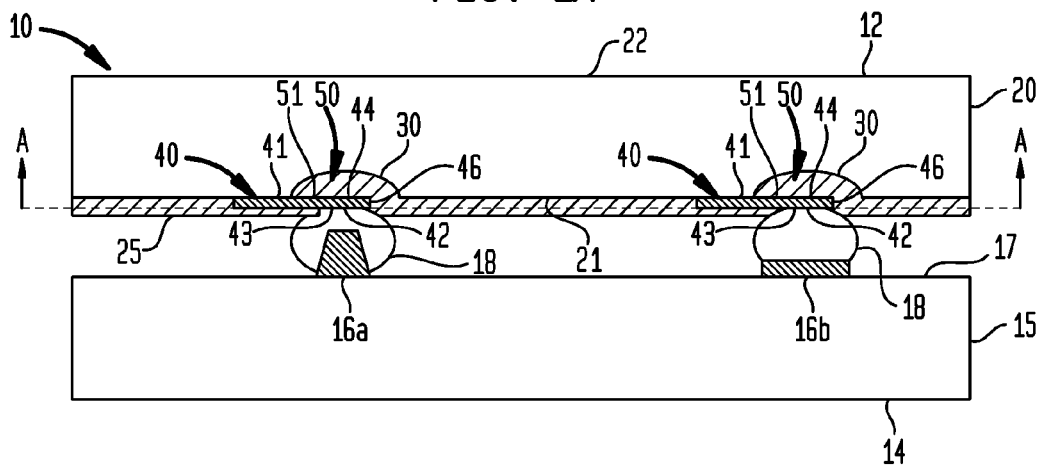
FIG. 1A is a side sectional view illustrating a stacked assembly having a contact structure in accordance with an embodiment of the invention.

With reference to FIG. 1A, a stacked microelectronic assembly 10 according to an embodiment of the present invention includes a first microelectronic unit 12 and a second microelectronic unit 14. In some embodiments, the first and second microelectronic units 12 and 14 may be a semiconductor chip, a wafer, a dielectric substrate, or the like. For example, one or both of the first microelectronic unit 12 and the second microelectronic unit 14 can include a memory storage element. As used herein, a "memory storage element" refers to a multiplicity of memory cells arranged in an array, together with circuitry usable to store and retrieve data therefrom, such as for transport of the data over an electrical interface.

The first microelectronic unit 12 includes a substrate 20 having a recess 30 extending from a major surface 21 partially through the substrate towards a second surface 22 opposite the major surface, and a conductive element 40 having an anchor portion 41 supported by the substrate, a joining portion 42 extending from the anchor portion, the joining portion at least partially overlying the recess 30 and at least partially exposed at the major surface for interconnection with a component external to the first microelectronic unit, and an end portion 46. As shown, the end portion 46 is located at an end of the joining portion 42. A dielectric region 50 overlies an inner surface 31 at least within the recess 30.

In FIG. 1A, the directions parallel to the major surface 21 are referred to herein as "horizontal" or "lateral" directions, whereas the directions perpendicular to the front surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The substrate 20 preferably has a coefficient of thermal expansion ("CTE") less than $10*10^{-6}/°$ C. (or ppm/° C.). In a particular embodiment, the substrate 20 can have a coefficient of thermal expansion ("CTE") less than $7*10^{-6}/°$ C. (or ppm/° C.). The substrate 20 preferably consists essentially of a material such as semiconductor, glass, or ceramic. In embodiments wherein the substrate 20 is made of a semiconductor, such as silicon, a plurality of active semiconductor devices (e.g., transistors, diodes, etc.) can be disposed in an active semiconductor region thereof located at and/or below the major surface 21 or the second surface 22. The thickness of the substrate 20 between the major surface 21 and the second surface 22 typically is less than 200 µm, and can be significantly smaller, for example, 130 µm, 70 µm or even smaller.

The substrate 20 can further include a dielectric layer disposed between the major surface 21 and at least one conductive element 40. A dielectric layer can overlie the second surface 22. Such a dielectric layer can electrically insulate conductive elements from the substrate 20. One or both of these dielectric layers can be referred to as a "passivation layer" of the first microelectronic unit 12. The dielectric layer can include an inorganic or organic dielectric material or both. The dielectric layer may include an electrodeposited conformal coating or other dielectric material, for example, a photoimageable polymeric material, for example, a solder mask material.

The microelectronic element 12 can include one or more conductive elements 40 exposed at the major surface 21 of the substrate 20. The joining portion 42 of each conductive element 40 can be exposed at the major surface 21 for interconnection with a component external to the first microelectronic element 12, such as the second microelectronic element 14. While not specifically shown in the figures, active semiconductor devices in the substrate 20 can be conductively connected to the joining portions 42. The active semiconductor devices, thus, can be accessible conductively through wiring incorporated extending within or above one or more dielectric layers of the substrate 20. The conductive elements 40 (and any of the other conductive elements described herein) can be made from any electrically conductive metal, including for example, copper or gold.

Figure 1B:
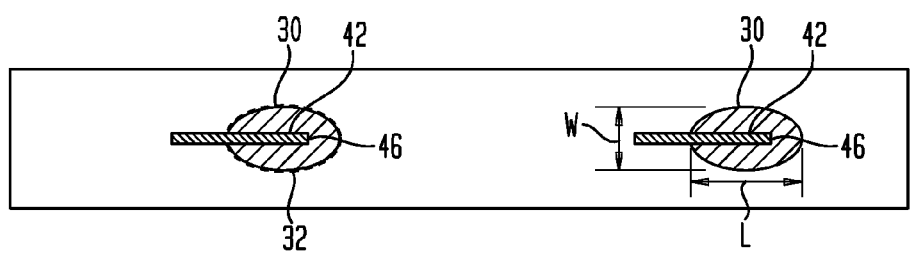
FIG. 1B is one embodiment of a corresponding bottom-up sectional view of the stacked assembly of FIG. 3A taken along the line A-A.
Figure 1C:
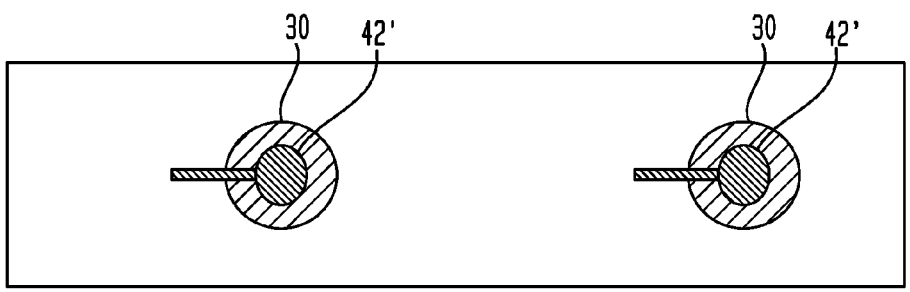
FIG. 1C is another embodiment of a corresponding bottom-up sectional view of the stacked assembly of FIG. 3A taken along the line A-A.

As shown, for example, in FIG. 1C, the joining portion 42' can have the bottom-view shape of a conductive bond pad, e.g., a thin flat member. Each joining portion 42 can have any bottom-view shape, including for example, a rectangular trace shape, as shown in FIG. 1B, a circular pad shape, as shown in FIG. 1C, an oval shape, a square shape, a triangular shape, or a more complex shape. In other embodiments, the joining portion 42 can be any other type of conductive contact, including for example, a conductive post.

The joining portion 42 can be aligned with the recess 30 and can be disposed wholly or partly within an area of the substrate 20 defined by the recess. As seen in FIG. 1A, the joining portion 42 is wholly disposed within an area defined by the recess 30. As shown, a plane defined by a top surface 43 of the joining portion 42 is substantially parallel to a plane defined by the major surface 21 of the substrate 20. As shown, a bottom surface 44 of the joining portion 42 is located at a plane defined by the major surface 21 of the substrate 20. In other embodiments, the bottom surface 44 of the joining portion 42 can be located above or below the plane defined by the major surface 21. The end portion 46 of the conductive element 40 is not supported by the substrate 20, such that the end portion can be cantilevered with respect to the anchor portion 41. Such an unsupported end portion 46 of the joining portion 42 that overlies the major surface 21 and is located adjacent to the dielectric region 50 can be free to move relative to the supported anchor portion 41, such that the joining portion 42 can function as a cantilever.

As used in this disclosure, a statement that an electrically conductive element is "exposed at" a surface of a substrate or a dielectric element overlying a surface of the substrate indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

While essentially any technique usable for forming conductive elements can be used to form the conductive elements described herein, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

The end portion 46 of the conductive element 40 is shown in the figures as not extending laterally (i.e., in a direction parallel to the major surface 21 of the substrate 20) beyond an outer boundary 32 (FIG. 1B) of the recess 30. In any of the embodiments disclosed herein, the end portion of the conductive element and/or the joining portion can extend laterally beyond the outer boundary of the recess. In one embodiment, an end of the joining portion can be coupled to a conductive trace (not shown) that extends laterally beyond the outer boundary of the corresponding recess, but the joining portion can still be movable relative to the corresponding substrate in the manner described below.

The recess 30 extends from the major surface 21 partially through the substrate 20 towards the second surface 22. The inner surface 31 of the recess 30 can extend from the major surface 21 through the substrate 20 at any angle. Preferably, the inner surface 31 extends from the major surface 21 at an angle between 0 and 90 degrees to the horizontal plane defined by the major surface 21. The inner surface 31 can have a constant slope or a varying slope. For example, the angle or slope of the inner surface 31 relative to the horizontal plane defined by the major surface 21 can decrease in magnitude (i.e., become less positive or less negative) as the inner surface 31 penetrates further towards the second surface 22.

The recess 30 can have any bottom-view shape, including for example, an oval, as shown in FIG. 1B, or a circle, as shown in FIG. 1C. In the embodiment shown in FIG. 1B, recess 30 has a width W in a first lateral direction along the major surface 21, and the recess has a length L in a second lateral direction along the major surface transverse to the first lateral direction, the length being greater than the width. In some examples, the recess 30 can have any three-dimensional shape, including for example, a cylinder, a cube, a prism, or a frustoconical shape, among others.

Figure 1D:
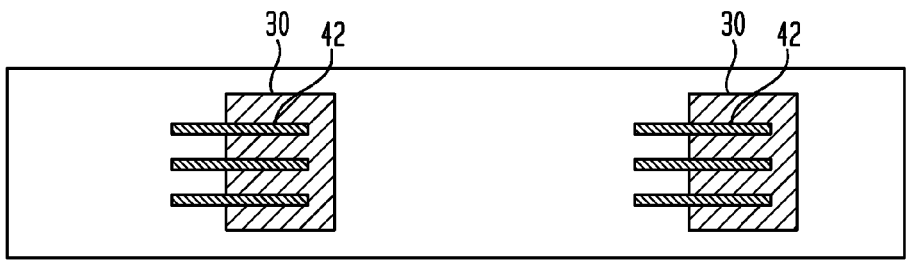
FIG. 1D is yet another embodiment of a corresponding bottom-up sectional view of the stacked assembly of FIG. 3A taken along the line A-A.

In a particular embodiment, the recess 30 can be a rectangular channel with a plurality of joining portions 42 at least partially overlying the recess, as shown in FIG. 1D. Any number of joining portions 42 can overlie a single recess 30, and the joining portions can be arranged in any geometric configuration overlying a single recess. For example, three joining portions 42 can be arranged along a common axis overlying a single recess 30, as shown in FIG. 1D.

In the embodiments shown, the dielectric region 50 fills the recess 30 such that a contour of the dielectric region conforms to a contour of the recess (i.e., the shape of the inner surface 31 of the recess). The dielectric region 50 can provide good dielectric isolation with respect to the substrate 20. The dielectric region 50 can be compliant, having a sufficiently low modulus of elasticity and sufficient thickness such that the product of the modulus and the thickness provide compliancy. Preferably, the joining portion 42 of the conductive element 40 at least partially overlies the dielectric region 50. A compliant dielectric region 50 can allow the joining portion 42 of the conductive element 40 to flex or move somewhat relative to the substrate 20 and the anchor portion 41 of the conductive element supported thereon when an external load is applied to the joining portion. In that way, the bond between the joining portions 42 of the first microelectronic unit 12 and terminals of the second microelectronic unit 14 may be able to better withstand thermal strain due to mismatch of the coefficient of thermal expansion ("CTE") between the first and second microelectronic units.

As used herein in connection with a joining portion of a conductive element, "movable" shall mean that the joining portion is capable of being displaced relative to the major surface of the substrate by an external load applied thereto, to the extent that the displacement appreciably relieves or reduces mechanical stresses, such as those caused by differential thermal expansion during operation, manufacturing, or testing of the microelectronic unit which would be present in the electrical connection with the conductive element absent such displacement.

The degree of compliancy provided by the product of the thickness of the dielectric region 50 and its modulus of elasticity can be sufficient to compensate for strain applied to the joining portions 42 due to thermal expansion mismatch between the first microelectronic unit 12 and the second microelectronic unit 14 to which the first microelectronic unit is mounted through the joining portions. An underfill (not shown) can be provided between an outer surface 51 of the dielectric region 50 and such second microelectronic unit 14 to enhance resistance to thermal strain due to CTE mismatch.

In the embodiments shown, the outer surface 51 (FIG. 1A) of the dielectric region 50 is located within a plane defined by the major surface 21 of the substrate 20. Alternatively, the outer surface 51 of the dielectric region 50 can extend above a plane defined by the major surface 21 of the substrate 20, or the outer surface of the dielectric region can be recessed below a plane defined by the major surface of the substrate.

A dielectric layer 25 can overlie the major surface 21 of the substrate 20 and portions of the conductive elements that are not the joining portions 42, to provide good dielectric isolation with respect to the substrate and the portions of the conductive elements that are not the joining portions. The dielectric layer 25 can include an inorganic or organic dielectric material or both. In a particular embodiment, the dielectric layer 25 can include the same compliant dielectric material as the dielectric region 50. In an exemplary embodiment, the dielectric layer 25 can be formed continuously with the dielectric region 50.

The second microelectronic unit 14 can include a substrate 15 and conductive contacts 16*a* and 16*b* at least partially exposed at a major surface 17 of the substrate for interconnection with joining portions 42 of the first microelectronic unit 12. By providing joining portions 42 in the first microelectronic unit 12 and rear conductive contacts in the second microelectronic unit 14, a plurality of microelectronic units can be stacked one on top of the other to form the stacked microelectronic assembly 10. In such arrangement, the joining portions 42 are aligned with the conductive contacts 16*a* and 16*b*.

As shown in FIG. 1A, the conductive contact 16*a* is a conductive post. The conductive post 16*a* can be any type of conductive post and may have any shape, including a frustoconical shape. The base and tip of each conductive post 16*a* may be substantially circular or have a different shape, e.g., oblong. Other examples of conductive posts can be used, as shown and described in the commonly-owned U.S. patent application Ser. No. 12/832,376, filed on Jul. 8, 2010. The conductive contact 16*b* is shown as a conductive pad. The conductive pad 16*b* can have any shape, including circular, square, oblong, rectangular, or a more complex shape.

Connection between the first microelectronic unit 12 and the second microelectronic unit 14 can be through conductive masses 18. The dielectric layer 25 and the dielectric region 50 at the major surface 21 of the substrate and a dielectric layer (e.g., a passivation layer) overlying the major surface 17 of the substrate 15 can provide electrical isolation between the first microelectronic unit 12 and the second microelectronic unit 14 except where interconnection is provided.

The conductive masses 18 can comprise a fusible metal having a relatively low melting temperature, e.g., solder, tin, or a eutectic mixture including a plurality of metals. Alternatively, the conductive masses 18 can include a wettable metal, e.g., copper or other noble metal or non-noble metal having a melting temperature higher than that of solder or another fusible metal. Such wettable metal can be joined with a corresponding feature, e.g., a fusible metal feature of an interconnect element such as the second microelectronic unit 14 to externally interconnect the first microelectronic unit 12 to such interconnect element. In a particular embodiment, the conductive masses 18 can include a conductive material interspersed in a medium, e.g., a conductive paste, e.g., metal-filled paste, solder-filled paste or isotropic conductive adhesive or anisotropic conductive adhesive.

Figure 2A:
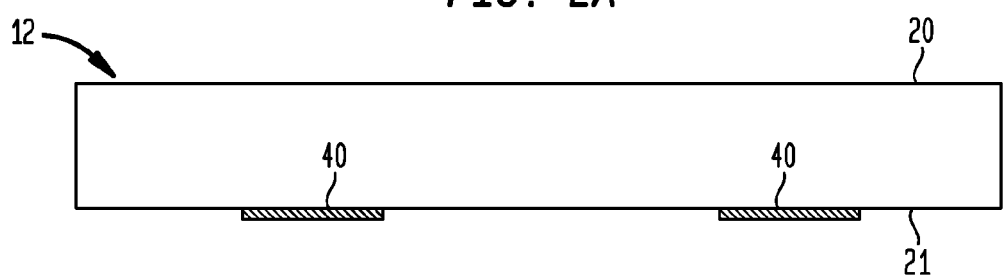
FIGS. 2A-2D are sectional views illustrating stages of fabrication in accordance with the embodiment of the invention depicted in FIG. 1A.

A method of fabricating the microelectronic assembly 10 (FIGS. 1A-1D) will now be described, with reference to FIGS. 2A-2D. As illustrated in FIG. 2A, the first microelectronic unit 12 includes the substrate 20 and one or more conductive elements 40 overlying the major surface 21. The conductive elements 40 may be insulated from the substrate 20 by a dielectric layer such as a passivation layer (not shown).

Figure 2B:
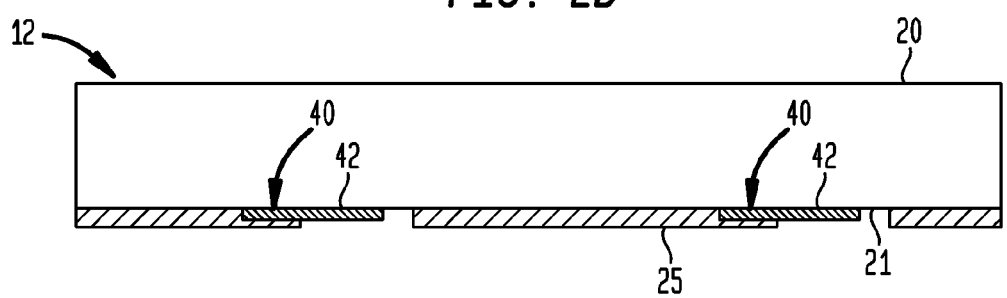

In the stage of fabrication illustrated in FIG. 2B, a dielectric layer 25 is formed on the major surface 21 of the substrate 20 and serves as an etch mask layer where it is desired to preserve remaining portions of the major surface. For example, the dielectric layer 25 can be a photoimageable layer, e.g., a photoresist layer, that is deposited and patterned to cover only portions of the major surface 21, after which a timed etch process can be conducted to form the recess 30. The joining portion 42 of each conductive element 40 can remain at least partially exposed at the major surface 21 (i.e., not covered by the dielectric layer 25) for connection to a component external to the first microelectronic unit 12.

Various methods can be used to form the dielectric layer 25. In one example, a flowable dielectric material is applied to the major surface 21 of the substrate 20, and the flowable material is then more evenly distributed across the major surface during a "spin-coating" operation, followed by a drying cycle which may include heating. In another example, a thermoplastic film of dielectric material can be applied to the major surface 21 after which the assembly is heated, or is heated in a vacuum environment, i.e., placed in an environment under lower than ambient pressure. In another example, vapor deposition can be used to form the dielectric layer 25.

In still another example, the assembly including the substrate 20 can be immersed in a dielectric deposition bath to form a conformal dielectric coating or dielectric layer 25. As used herein, a "conformal coating" is a coating of a particular material that conforms to a contour of the surface being coated, such as when the dielectric layer 25 conforms to a contour of the major surface 21. An electrochemical deposition method can be used to form the conformal dielectric layer 25, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrode-posited conformal dielectric layer 25 on exposed surfaces of the substrate which are conductive or semiconductive, including but not limited to along the major surface 21. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on a remaining passivation layer overlying the major surface 21, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 25 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |

TABLE 1-continued

| | | | |
|---|---|---|---|
| ANODE | SS316 | SS316 | SS316 |
| VOLTS | | 200-400 | >100 |
| ECOAT NAME | ELECTROLAC | LECTRASEAL DV494 | LECTROBASE 101 |
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Figure 2C:
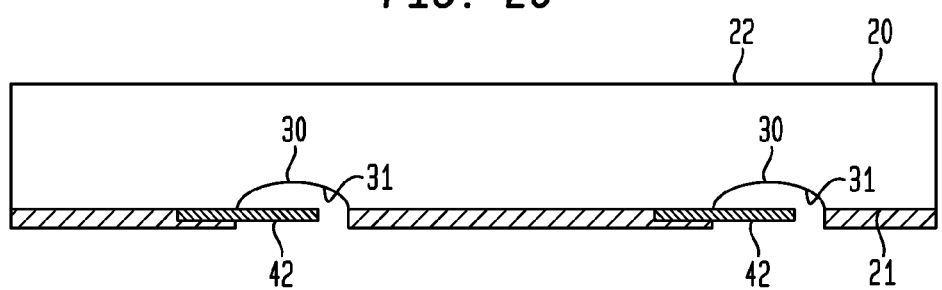

Thereafter, in the stage of fabrication illustrated in FIG. 2C, the recess 30 can be formed extending downwardly from the major surface 21 towards the second surface 22 of the substrate 20. The recess 30 can be formed for example, by selectively etching the substrate 20 to remove material of the substrate, after forming a mask layer (e.g., the dielectric layer 25) where it is desired to preserve remaining portions of the major surface 21. The recess 30 can be formed such that material of the substrate 20 supporting at least the joining portion 42 is removed.

The inner surfaces 31 of the recess 30, extending downwardly from the major surface 21 towards the second surface 22, may be sloped, i.e., may extend at angles other a normal angle (right angle) to the major surface, as shown in FIG. 2C. Wet etching processes, e.g., isotropic etching processes and sawing using a tapered blade, among others, can be used to form recesses 30 having sloped inner surfaces 31. Laser ablation, mechanical milling, chemical etching, plasma etching, directing a jet of fine abrasive particles towards the substrate 20, among others, can also be used to form the recesses 30 (or any other hole or opening described herein) having sloped inner surfaces 31.

Alternatively, instead of being sloped, the inner surfaces of the recess 30 may extend in a vertical or substantially vertical direction downwardly from the major surface 21 substantially at right angles to the major surface. Anisotropic etching processes, laser ablation, mechanical removal processes, e.g., milling, ultrasonic machining, directing a jet of fine abrasive particles towards the substrate 20, among others, can be used to form recesses 30 having essentially vertical inner surfaces.

Figure 2D:
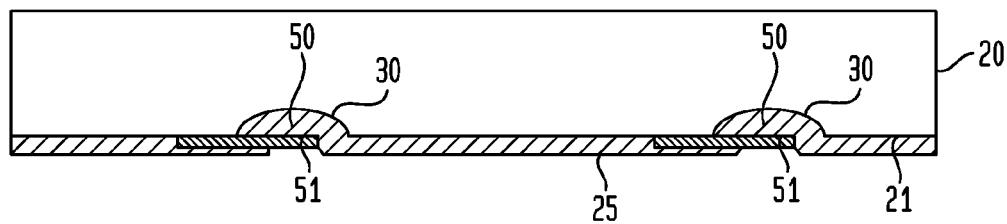

Thereafter, in the stage of fabrication illustrated in FIG. 2D, the dielectric region 50 is formed inside the recess 30. The dielectric region 50 can include an inorganic material, a polymeric material, or both. Optionally, the dielectric region 50 can be formed such that the exposed outer surface 51 of the region is co-planar or substantially co-planar with the major surface 21 of the substrate 20 or an exposed surface of the dielectric layer 25. For example, a self-planarizing dielectric material can be deposited in the recess 30, e.g., by a dispensing or stenciling process. In another example, a grinding, lapping, or polishing process can be applied to the major surface 21 of the substrate 20 or the exposed surface of the dielectric layer 25 after forming the dielectric region 50 to planarize the surface of the dielectric region 50 to the major surface 21 or the exposed surface of the dielectric layer 25.

Thereafter, referring again to FIG. 1A, the first microelectronic unit 12 can be stacked on top of the second microelectronic unit 14, thereby forming the stacked microelectronic assembly 10. As described above, connection between the first microelectronic unit 12 and the second microelectronic unit 14 can be through conductive masses 18. The conductive masses 18 can provide an electrical connection between the joining portions 42 of the first microelectronic unit 12 and the conductive contacts 16a and 16b of the second microelectronic unit 14. In such arrangement, the joining portions 42 are aligned with the conductive contacts 16a and 16b.

Figure 3A:
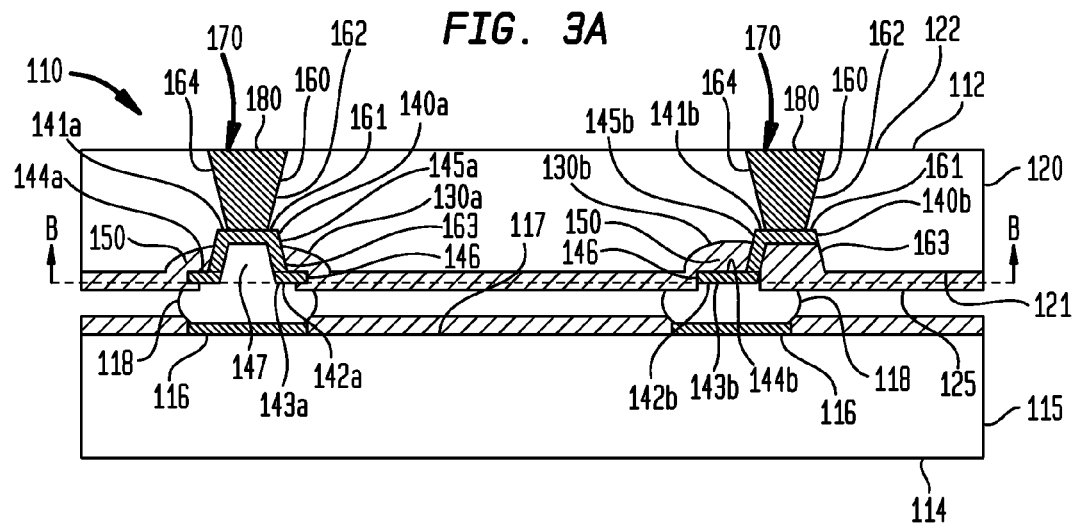
FIG. 3A is a side sectional view illustrating a stacked assembly having a contact structure in accordance with an embodiment of the invention.

Referring now to FIG. 3A, a stacked microelectronic assembly 110 according to another embodiment of the present invention includes a first microelectronic unit 112 and a second microelectronic unit 114. The microelectronic units 112 and 114 can have similar functions as the microelectronic units 12 and 14 described above.

The first microelectronic unit 112 includes a substrate 120 having a recess 130a and 130b extending from a major surface 121 partially through the substrate towards a second surface 122 opposite the major surface, and conductive elements 140a and 140b each having a respective anchor portion 141a or 141b supported by the substrate, a respective joining portion 142a or 142b at least partially overlying the respective recess 130a or 130b and at least partially exposed at the major surface for interconnection with a component external to the first microelectronic unit, one or more respective connecting portions 145a or 145b extending between the anchor and joining portions, and end portions 146. As shown, the end portions 146 are located at an end of each joining portion 142a and 142b. A dielectric region 150 overlies an inner surface 131 at least within the recess 130a or 130b.

The substrate 120 further includes a hole 160 extending from the opening 130 to the second surface 122 and a conductive via 170 extending within the hole from the respective anchor portion 141a or 141b to the second surface. The conductive via 170 includes a contact portion 180 exposed at the second surface 122 for interconnection with a component external to the stacked microelectronic assembly 110.

The substrate 120 has similar properties as the substrate 20 described above with reference to FIGS. 1A through 2D. For example, the substrate 120 preferably has a CTE less than 10 ppm/° C., and the substrate 120 preferably consists essentially of a material such as a semiconductor, glass or ceramic. In embodiments wherein the substrate 120 is made of a semiconductor, such as silicon, a plurality of active semiconductor devices can be disposed therein. The substrate 120 can further include a dielectric layer (e.g., a "passivation layer") overlying the major surface 121 and/or the second surface 122.

The microelectronic element 112 can include one or more conductive elements 140a and 140b exposed at the major surface 121 of the substrate 120. The joining portions 142a and 142b of the respective conductive elements 140a and 140b can be exposed at the major surface 121 for interconnection with a component external to the first microelectronic element 112, such as the second microelectronic element 114. Active semiconductor devices in the substrate 120 can be conductively connected to the joining portions 142a and 142b.

Figure 3B:
FIG. 3B is one embodiment of a corresponding bottom-up sectional view of the stacked assembly of FIG. 1A taken along the line B-B.
Figure 3C:
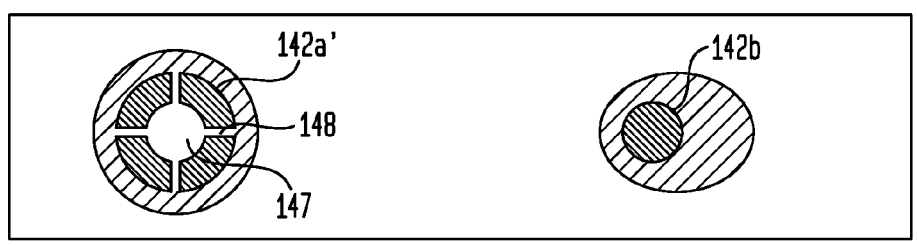
FIG. 3C is another embodiment of a corresponding bottom-up sectional view of the stacked assembly of FIG. 1A taken along the line B-B.

Each joining portion 142a and 142b can have any bottom-view shape. As shown, for example, in FIG. 3B, the joining portions 142a and 142b can have the shape of a conductive bond pad, e.g., a thin flat member, or a portion of a conductive bond pad. For example, the joining portion 142b shown in FIGS. 3B and 3C has a round, solid bottom-view shape. The joining portion 142a shown in FIG. 3B has a round bottom-view shape with an aperture 147 extending therethrough. The joining portion segments 142a' shown in FIG. 3C together have a round bottom-view shape, with the aperture 147 extending therethrough and gaps 148 extending between adjacent joining portion segments.

Figure 3D:
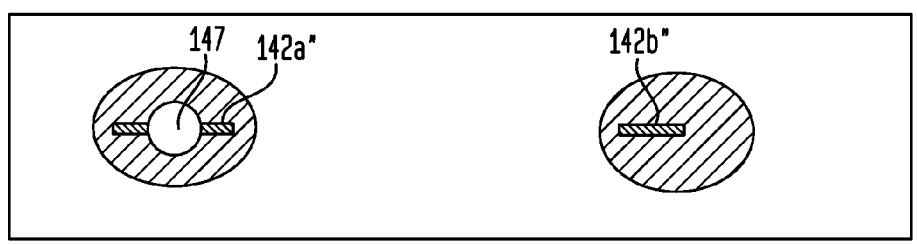
FIG. 3D is yet another embodiment of a corresponding bottom-up sectional view of the stacked assembly of FIG. 1A taken along the line B-B.

The joining portions 142a and 142b can have other bottom-view shapes, including, for example, a rectangular trace shape or rectangular trace shape portions. For example, the joining portion 142b" shown in FIG. 3D has a rectangular trace shape. The joining portions 142a" shown in FIG. 3D are rectangular trace-shaped portions having the aperture 147 located therebetween. The joining portions 142a and 142b can alternatively have more complex shapes. In other embodiments, the joining portions 142a and 142b can be any other type of conductive contact, including for example, a conductive post.

The joining portions 142a and 142b can be aligned with the respective recess 130a or 130b and can be disposed wholly or partly within an area of the substrate 120 defined by the recess. As seen in FIG. 3A, the joining portions 142a and 142b are wholly disposed within an area defined by the respective recess 130a or 130b. As shown, a plane defined by top surfaces 143a and 143b of the respective joining portions 142a or 142b are substantially parallel to a plane defined by the major surface 121 of the substrate 120. As shown, bottom surfaces 144a and 144b of the respective joining portions 142a or 142b are located at a plane defined by the major surface 121 of the substrate 120. In other embodiments, the bottom surfaces 144a and 144b can be located above or below the plane defined by the major surface 121.

The connecting portions 145a and 145b extend downwardly from the respective joining portions 142a or 142b to the respective anchor portion 141a or 141b. At least a portion of the connecting portions 145a and 145b have a contour not conforming to a contour of the inner surfaces 131 of the respective recess 130a or 130b. In a particular embodiment, there can be a single trace-shaped connecting portion 145b extending from the anchor portion 141b to the joining portion 142b. In alternative embodiments, there can be any number of connecting portions extending from the anchor portion. For example, in one embodiment, the connecting portion 145a can have a hollow frustoconical shape with an internal aperture 147, such as in the embodiment shown in FIG. 3B. In another embodiment, there can be four individual connecting portions extending between a single anchor portion 141a and respective joining portions such as the joining portions 142a' shown in FIG. 3C. In still another embodiment, there can be two individual connecting portions extending between a single anchor portion 141a and respective joining portions such as the joining portions 142a" shown in FIG. 3D. The joining portions 142a and 142b preferably are non-centered relative to the respective connecting portions 145a or 145b, such that the end portion 146 of the respective conductive element 140a or 140b can be cantilevered with respect to the respective anchor portion 141a or 141b.

The recesses 130a and 130b are similar to the recess 30 shown and described above with reference to FIGS. 1A through 2D. The recesses 130a and 130b extend from the major surface 121 partially through the substrate 120 towards the second surface 122. The inner surfaces 131 of the recesses 130a and 130b can extend from the major surface 121 through the substrate 120 at any angle. Preferably, the inner surfaces 131 extend from the major surface 121 at an angle between 0 and 90 degrees to the horizontal plane defined by the major surface 121.

The recesses 130a and 130b can have any bottom-view shape, including for example, an oval, such as the recess 130b shown in FIGS. 1B-1D, or a circle, such as the recess 130a shown in FIGS. 1B and 1C. In some examples, the recesses 130a and 130b can have any three-dimensional shape, including for example, a cylinder, a cube, a prism, or a frustoconical shape, among others. In a particular embodiment, the recesses 130a and 130b can be a rectangular channel with a plurality of respective joining portions 142a and 142b at least partially overlying the recess, in a configuration similar to that of the joining portions 42 shown in FIG. 1D.

The dielectric region 150 has similar possible configurations and properties as the dielectric region 50 shown and described above with reference to FIGS. 1A through 2D. For example, in the embodiments shown in FIGS. 3A-3D, the dielectric region 150 fills the recesses 130a and 130b such that a contour of the dielectric region conforms to a contour of the recess (i.e., the shape of the inner surfaces 131 of the recesses). The dielectric region 150 can be compliant, having a sufficiently low modulus of elasticity and sufficient thickness such that the product of the modulus and the thickness provide compliancy. Preferably, the joining portions 142a and 142*b* at least partially overlie the dielectric region 150, such that the joining portions can be movable relative to the substrate 120.

Similar to the dielectric layer 25 described above with reference to FIGS. 1A through 2D, a dielectric layer 125 can overlie the major surface 121 of the substrate 120 and portions of the conductive elements 140*a* and 140*b* that are not the joining portions 142*a* and 142*b*, to provide good dielectric isolation with respect to the substrate and the portions of the conductive elements that are not the joining portions.

As shown in FIGS. 3A-3D, the hole 160 is staged, including a first opening 161 extending from the opening 130 towards the second surface 122 and a second opening 162 extending from the first opening to the second surface. The staged hole 160 can have any of the structures shown and described in greater detail in the commonly owned U.S. patent application Ser. No. 12/842,717, filed Jul. 23, 2010, and the commonly owned U.S. Patent Application Publication No. 2008/0246136, which are hereby incorporated by reference herein. In other embodiments, such as the hole 60*b* shown and described with reference to FIG. 6, the hole can have a more simple non staged structure.

The first opening 161 extends from the recess 130 partially through the substrate 120 towards the second surface 122. The first opening 161 includes inner surfaces 163 that extend from the recess 130 through the substrate 120 at an angle between 0 and 90 degrees to the horizontal plane defined by the major surface 121. The inner surfaces 163 can have a constant slope or a varying slope. For example, the angle or slope of the inner surfaces 163 relative to the horizontal plane defined by the major surface 121 can decrease in magnitude (i.e., become less positive or less negative) as the inner surfaces 163 penetrate further towards the second surface 122. As shown, for example, in FIG. 4D, the first opening 161 has a width W1 at the recess 130 and a width W2 where the first opening meets the second opening 162 that is less than W1 such that the first opening is tapered in a direction from the major surface 121 towards the second surface 122. In other examples, the first opening can have a constant width, or the first opening can be tapered in a direction from the second surface towards the front surface. The first opening 161 can have any three-dimensional shape, including for example, cubic, cylindrical, frustoconical, or a prism, among others.

The second opening 162 extends from the first opening 161 partially through the substrate 120 towards the second surface 122. The second opening 162 includes inner surfaces 164 that extend from the first opening 161 through the substrate 120 at an angle between 0 and 90 degrees to the horizontal plane defined by the major surface 121. Similar to the inner surfaces 163 described above, the inner surfaces 164 can have a constant slope or a varying slope. As shown, for example, in FIG. 4D, the second opening 162 has a width W3 where the second opening meets the first opening 161 and a width W4 at the second surface 122 that is greater than W3 such that the first opening is tapered in a direction from the second surface 122 towards the major surface 121. In other examples, the second opening can have a constant width, or the second opening can be tapered in a direction from the front surface towards the second surface. The second opening 162 can have any three-dimensional shape, including for example, cubic, cylindrical, frustoconical, or a prism, among others.

In a particular embodiment, the inner surfaces 163 and 164 can extend in first and second directions relative to the major surface 121, respectively, to define a substantial angle. Any number of first openings 161 can extend from a single second opening 162, and any number of second openings can extend from a single first opening. The first and second openings 161 and 162 can be arranged in any geometric configuration relative to each other and relative to the substrate 120. Particular examples of various first and second opening configurations and methods of forming these configurations are described in the aforementioned commonly owned U.S. patent application Ser. No. 12/842,717 and U.S. Patent Application Publication No. 2008/0246136.

The anchor portions 141*a* and 141*b* of the respective conductive elements 140*a* and 140*b* preferably have contours that conform to a contour of the respective first opening 161, such that the anchor portions have positions that are fixed relative to the substrate 120. An anchor portion 141*a* or 141*b* can serve as a fulcrum about which an attached joining portion 142*a* or 142*b* can pivot when put under mechanical stress such as that caused by differential thermal expansion relative to an attached microelectronic unit.

The conductive via 170 extends through the hole 160 between the respective anchor portion 141*a* or 141*b* and the second surface 122. As shown in FIG. 3A, the conductive via 170 can fill all of the volume within the second opening 162 inside of an optional dielectric layer (not shown) that can electrically insulate the substrate 120 from the conductive via. The conductive via 170 can conform to the contour of the second opening 162. The conductive via 170 may have a cylindrical or frustoconical shape. The conductive via 170 can be made from a metal or an electrically conductive compound of a metal, including for example, copper or gold.

In other embodiments (not shown), a contour of the conductive via 170 (i.e., the shape of the outer surface of the conductive via) does not conform to a contour of the second opening 162 (i.e., the shape of the inner surface 164 of the second opening). In such non-conformal conductive via embodiments, the conductive via 170 can have any shape, including for example, a cylindrical shape, frustoconical shape, or a combination of a cylindrical and a frusto-conical shape at different distances from the second surface 122.

The conductive via 170 can be solid or hollow. In some embodiments, the conductive via can include an internal space that is filled with a dielectric material. For example, the conductive via 170 can be formed by depositing a metal overlying the inner surface 164 of the second opening 162, thereby producing a conductive layer overlying the inner surface second opening. Particular examples of various conductive via configurations and methods of forming these configurations are described in the aforementioned commonly owned U.S. patent application Ser. No. 12/842,717 and U.S. Patent Application Publication No. 2008/0246136.

The conductive vias 170 each include a contact portion 180 exposed at the second surface 122 for interconnection with a component external to the stacked microelectronic assembly 110. In some embodiments, each conductive via 170 can be electrically coupled to a separate conductive contact exposed at the second surface 122.

The second microelectronic unit 114 is similar to the second microelectronic unit 14 shown and described above with reference to FIG. 1A. The second microelectronic unit 114 can include a substrate 115 and conductive contacts 116 at least partially exposed at a major surface 117 of the substrate for interconnection with the joining portions 142*a* and 142*b* of the first microelectronic unit 112.

As shown in FIG. 3A, the conductive contacts 116 are conductive pads. The conductive pads 116 can have any shape, including circular, square, oblong, rectangular, or a more complex shape. In particular embodiments, the conductive contacts 116 can be any type of conductive contact, including, for example, a conductive post such as the conductive post 16*a* shown in FIG. 1A. Other examples of conductive posts can be used, as shown and described in the commonly-owned U.S. patent application Ser. No. 12/832,376, filed on Jul. 8, 2010.

Connection between the first microelectronic unit 112 and the second microelectronic unit 114 can be through conductive masses 118, in a manner similar to that described with reference to FIGS. 1A through 2D. The dielectric layer 125 and the dielectric region 150 at the major surface 121 of the substrate 120 and a dielectric layer (e.g., a passivation layer) overlying the major surface 117 of the substrate 115 can provide electrical isolation between the first microelectronic unit 112 and the second microelectronic unit 114 except where interconnection is provided.

A method of fabricating the microelectronic assembly 110 (FIGS. 3A-3D) will now be described, with reference to FIGS. 4A-4D. In the stage of fabrication illustrated in FIG. 4A, the first microelectronic unit 112 includes the substrate 120. The holes 160 can be formed extending from the major surface 121 to the second surface 122 of the substrate 120 by removing material from the substrate. In a particular embodiment, the first opening 161 can be formed extending inwardly from the major surface 121, and the second opening can be formed extending inwardly from the second surface 122. In other embodiments, either or both of the first and second openings 161 and 162 can be formed from either the major or second surfaces 121 and 122.

The holes 160 can be formed in a similar manner and using similar processes as described above with respect to forming the recess 30. For example, the holes 160 can be formed by selectively etching the substrate 120 to remove material of the substrate, after forming a mask layer where it is desired to preserve remaining portions of the major surface 121. Similar to the recess 30, the inner surfaces 163 and 164 of the first and second openings 161 and 162 can extend at any constant or variable angle relative to the major surface 121.

Although not shown, a dielectric layer can optionally be formed on the major surface 121 of the substrate 120 and/or overlying the inner surfaces 163 and 164 of the first and second openings 161 and 162 to provide electrical isolation of the conductive elements 140a and 140b and the conductive vias 170 from the substrate. Such a dielectric layer can be formed using any of the various methods described above with reference to the dielectric layer 25 shown in FIG. 2B. Such a dielectric layer can be in addition of or instead of a passivation layer that may already be overlying the major surface 121 of the substrates 120.

Figure 4A:
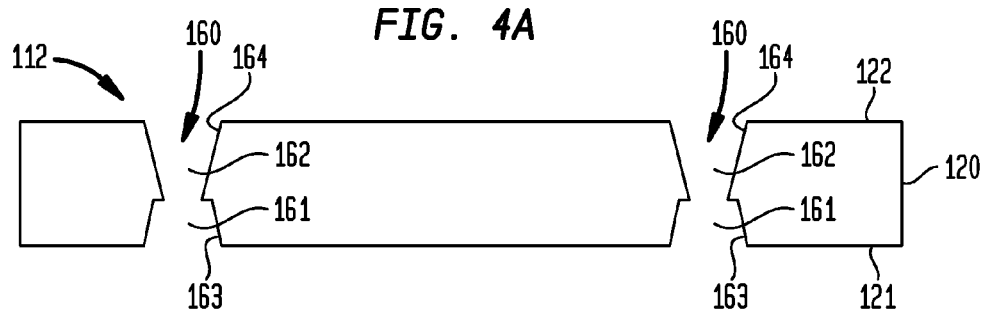
FIGS. 4A-4E are sectional views illustrating stages of fabrication in accordance with the embodiment of the invention depicted in FIG. 3A.
Figure 4B:
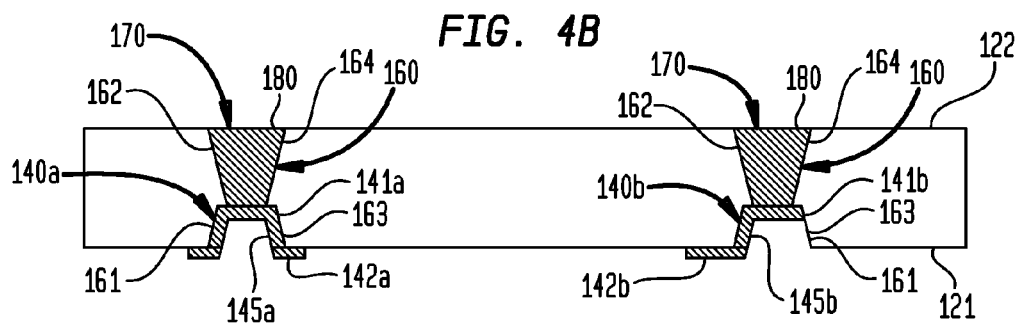

In the stage of fabrication illustrated in FIG. 4B, the anchor portions 141a and 141b and the respective connecting portions 145a and 145b of the conductive elements 140a and 140b can be formed within the first openings 161, the joining portions 142a and 142b can be formed overlying the major surface 121, and the conductive vias 170 can be formed within the second openings 162, with the contact portion 180 exposed at the second surface 122. Each of the anchor portions 141a and 141b, the connecting portions 145a and 145b, the joining portions 142a and 142b, and the conductive vias 170 can be formed in a single metal deposition process or separate processes. In an embodiment where the conductive vias 170 are electrically coupled to separate conductive contacts exposed at the second surface 122, such conductive contacts can be formed in a single metal deposition process along with the conductive elements 140a and 140b and the conductive vias, or such conductive contacts can be formed in a separate process.

An exemplary method of forming the conductive elements 140a and 140b and the conductive vias 170 involves depositing a metal layer by one or more of sputtering a primary metal layer onto exposed surfaces of the substrate 120, plating, or mechanical deposition. Mechanical deposition can involve the directing a stream of heated metal particles at high speed onto the surface to be coated. This step can be performed by blanket deposition onto the major surface 121 and the inner surfaces 163 and 164, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the conductive elements 140a and 140b and the conductive vias 170. In particular examples, a stack including a plurality of metal layers can be formed on one or more of the afore-mentioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

In a particular embodiment, the joining portions 142a and 142b can be deposited onto the major surface 121 of the substrate 120 before removing any material from the substrate, for example, as shown in the stage of fabrication illustrated in FIG. 2A. In such an embodiment, the holes 160 can be formed, for example, by etching through the joining portions 142a and/or 142b and then etching into the substrate 120. After the holes 160 are formed through the joining portions 142a and/or 142b, the connecting portions 145a and 145b, the anchor portions 141a and 141b, and the conductive vias 170 can be formed as described above.

Figure 4C:
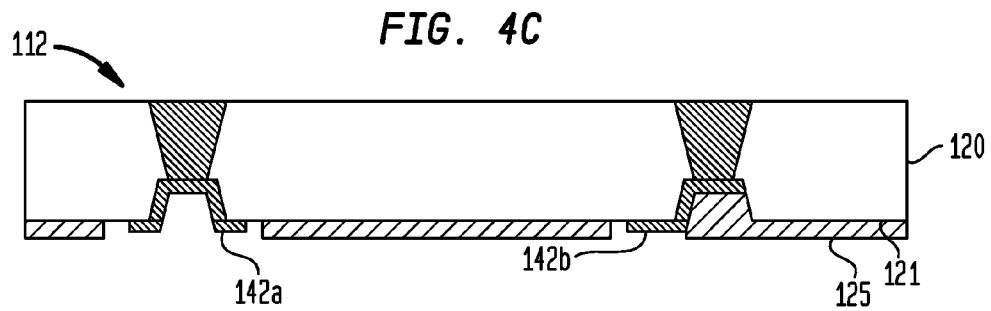

In the stage of fabrication illustrated in FIG. 4C, the dielectric layer 125 is formed on the major surface 121 of the substrate 120 and serves as an etch mask layer where it is desired to preserve remaining portions of the major surface. The dielectric layer 125 can be formed using any of the various methods described above with reference to the dielectric layer 25 shown in FIG. 2B. The joining portions 142a and 142b can remain at least partially exposed at the major surface 121 (i.e., not covered by the dielectric layer 125) for connection to a component external to the first microelectronic unit 112.

Figure 4D:
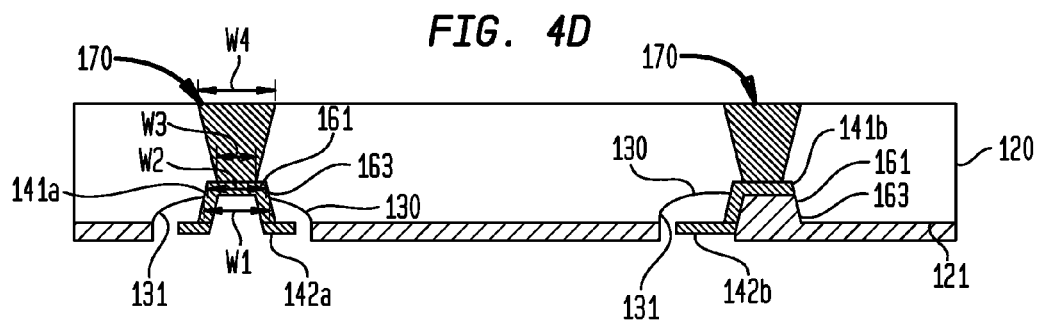

Thereafter, in the stage of fabrication illustrated in FIG. 4D, the recesses 130 can be formed in a similar manner and using similar processes as described above with respect to forming the recess 30. For example, the recesses 130 can be formed by selectively etching the substrate 120 to remove material of the substrate, after forming a mask layer (e.g., the dielectric layer 25) where it is desired to preserve remaining portions of the major surface 121. The recess 130 can be formed such that material of the substrate 120 supporting at least the joining portions 142a and 142b is removed. Similar to the recess 30, the inner surfaces 131 of the recesses 130 can extend at any constant or variable angle relative to the major surface 121.

As shown in FIG. 4D, the recesses 130 can be formed such that they do not extend as far from the major surface 121 as the first openings 161, such that contours of the anchor portions 141a and 141b conform to a contour of the remaining part of the inner surface 163 of the first opening. In a particular embodiment, the recesses 130 can be formed such that they extend at least as far from the major surface 121 as the first openings 121, such that the contours of the anchor portions 141a and 141b do not conform to contours of any inner surfaces of the substrate 120. In such an embodiment, the anchor portions 141a and 141b can be fixed to the substrate 120 through the attachment between the anchor portions and the conductive vias 170 that can have contours that conform to contours of the inner surfaces 164 of the second openings 162.

Figure 4E:
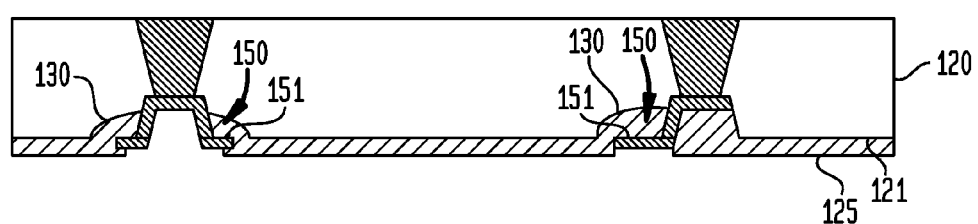

Thereafter, in the stage of fabrication illustrated in FIG. 4E, the dielectric regions 150 can be formed inside the recesses 130 in a similar manner and using similar processes as described above with respect to forming the dielectric region 50 inside the recess 30. For example, the dielectric region 150 can be formed such that an exposed outer surface 151 of the region is co-planar or substantially co-planar with the major surface 121 of the substrate 120 (as shown in FIG. 4E) or an exposed surface of the dielectric layer 125.

Thereafter, referring again to FIG. 3A, the first microelectronic unit 112 can be stacked on top of the second microelectronic unit 114, thereby forming the stacked microelectronic assembly 110. As described above, connection between the first microelectronic unit 112 and the second microelectronic unit 114 can be through conductive masses 118. The conductive masses 118 can provide an electrical connection between the joining portions 142a and 142b of the first microelectronic unit 112 and the conductive contacts 16 of the second microelectronic unit 114. In such arrangement, the joining portions 142a and 142b are aligned with the respective conductive contacts 16.

Figure 5:
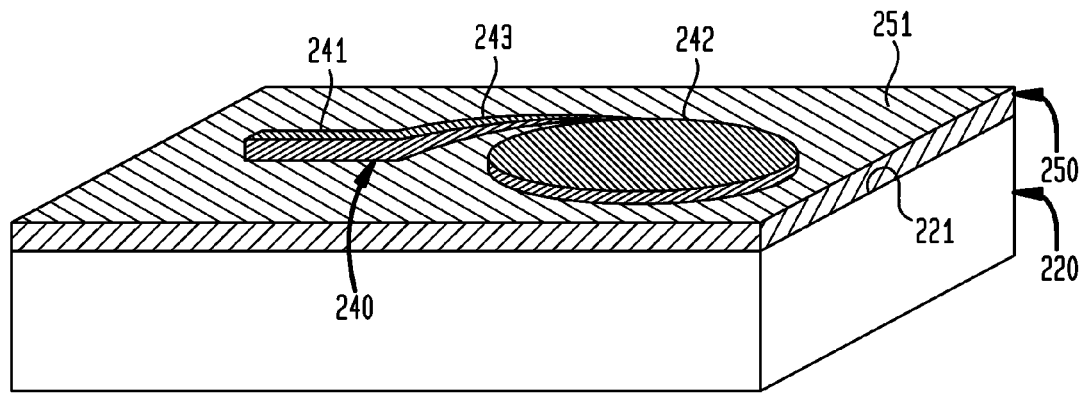
FIG. 5 is a top perspective view of a substrate having a pad electrically connected with a chip in accordance with the present invention.

As shown in FIG. 5, a base portion 241 and a joining portion 242 of a conductive element 240 is shown that is suitable for use in any of the embodiments described above with reference to FIGS. 1A-4E. The joining portion 242 extends from the base portion 241 of the conductive element 240. The base portion 241 can be, for example, part of the joining portion 142a or 142b described above with reference to the first microelectronic unit 112 shown in FIG. 3A, or part of the anchor portion 41 described above with reference to the first microelectronic unit 12 shown in FIG. 1A. The base portion 241 can be connected to other conductive elements located beneath the major surface 221 of the substrate 220 or beneath an outer surface 251 of the dielectric region 250. In the embodiment shown in FIG. 5, the base portion 241 includes a segment 243 that is compliant or movable in a direction of a plate defined by the major surface 221, such that the segment is capable of being displaced in a direction along the major surface 221 by an external load applied thereto.

Figure 6:
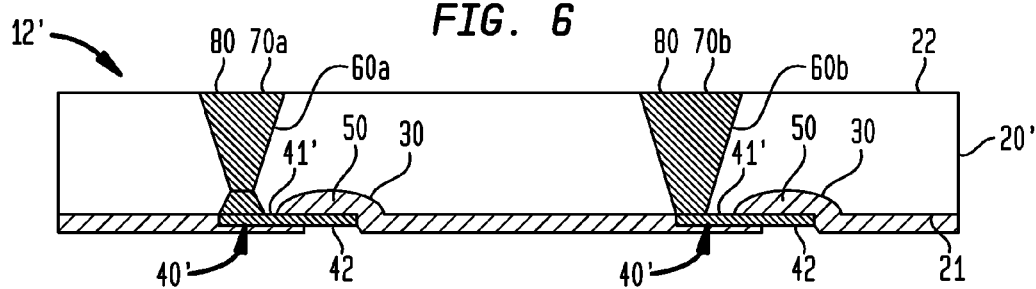
FIG. 6 is a side sectional view illustrating a substrate having a contact structure in accordance with another embodiment of the invention.

Referring now to FIG. 6, a first microelectronic assembly 12' according to another embodiment is similar to the first microelectronic assembly 12 shown in FIG. 1A, except that the conductive elements 40' are electrically connected to conductive vias 70a and 70b extending between the major surface 21 and the second surface 22 of the substrate 20'.

The substrate 20' includes holes 60a and 60b extending from the major surface 21 and the second surface 22, and the conductive vias 70a and 70b extend within the respective holes from respective anchor portions 41' of the conductive elements 40' to the second surface. Each conductive via 70a and 70b includes a contact portion 80 exposed at the second surface 22 for interconnection with a component external to the first microelectronic unit 12'. The hole 60a is a staged hole similar to the holes 160 shown in FIG. 3A, except that the openings 30 do not overlap with either of the holes 60a or 60b, so the holes 60a and 60b extend from the second surface 22 to the major surface 21, rather than from the second surface to a respective opening. The hole 60b is not staged, i.e., the hole 60b can be formed, for example, in a single etching or other process of removing material from the substrate 20'.

Similar to the first microelectronic assembly 12 shown in FIG. 1A, each conductive element 40 includes a joining portion 42 that can be exposed at the major surface 21 for interconnection with a component external to the first microelectronic element 12'. Also similar to the first microelectronic assembly 12, the dielectric regions 50 can be compliant, such that each joining portion 42 can be movable relative to the substrate 20'.

Figure 7:
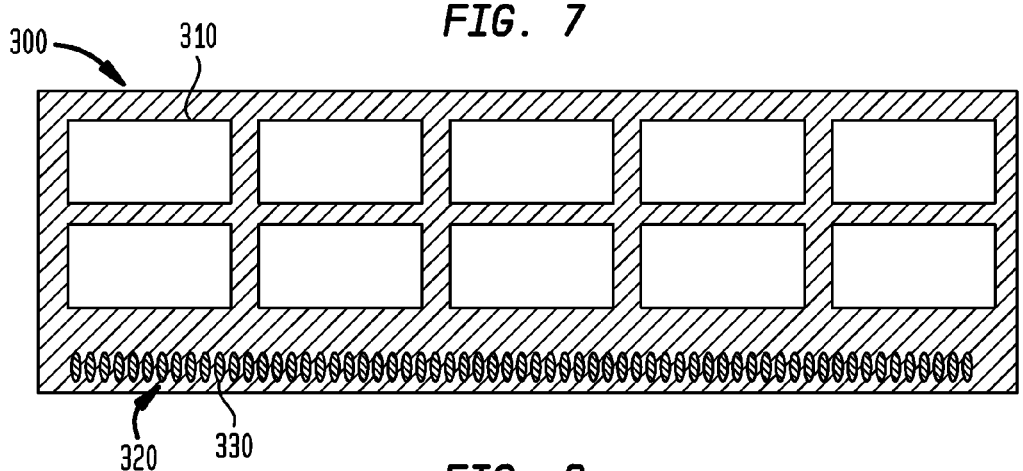
FIG. 7 is a schematic depiction of a module according to one embodiment of the invention.

FIG. 7 depicts a module 300 including at least two microelectronic assemblies 310 arranged together in one unit having an electrical interface 320 for transport of signals to and from each of the microelectronic assemblies 310. The electrical interface can include one or more contacts usable for transport of signals or reference potentials, e.g., power and ground, which are common to each of the microelectronic elements therein. The microelectronic assemblies 310 may be any of the assemblies described above. In a particular example, the module 300 can be a dual in-line memory module ("DIMM") or single in-line memory module ("SIMM") having one or more portions thereof sized for insertion into a corresponding slot of other connector of a system, such as can be provided on a motherboard. In such DIMM or SIMM, the electrical interface can have contacts 330 that are suitable for mating with a plurality of corresponding spring contacts within such slot connector. Such spring contacts can be disposed on single or multiple sides of each slot to mate with corresponding module contacts. Various other modules and interconnection arrangements are possible in which a module may have unstacked or stacked microelectronic assemblies, or which may have parallel or serial electrical interfaces, or a combination of parallel and serial electrical interfaces for transport of electrical signals to and from the module. Any kind of electrical interconnection arrangement between the module 300 and a further system interface is contemplated by the invention.

Figure 8:
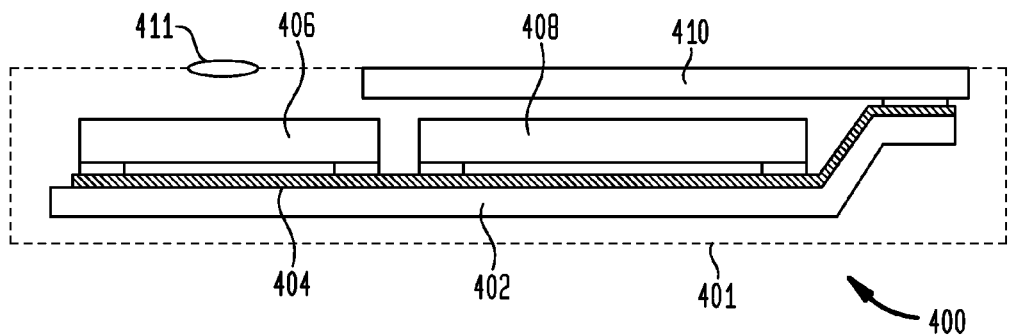
FIG. 8 is a schematic depiction of a system according to one embodiment of the invention.

The microelectronic assemblies described above can be utilized in construction of diverse electronic systems, as shown in FIG. 8. For example, a system 400 in accordance with a further embodiment of the invention includes a microelectronic assembly 406 as described above in conjunction with other electronic components 408 and 410. In the example depicted, component 408 is a semiconductor chip whereas component 410 is a display screen, but any other components can be used. Of course, although only two additional components are depicted in FIG. 8 for clarity of illustration, the system may include any number of such components. The microelectronic assembly 406 may be any of the assemblies described above. In a further variant, any number of such microelectronic assemblies may be used.

Microelectronic assembly 406 and components 408 and 410 are mounted in a common housing 401, schematically depicted in broken lines, and are electrically interconnected with one another as necessary to form the desired circuit. In the exemplary system shown, the system includes a circuit panel 402 such as a flexible printed circuit board, and the circuit panel includes numerous conductors 404, of which only one is depicted in FIG. 8, interconnecting the components with one another. However, this is merely exemplary; any suitable structure for making electrical connections can be used.

The housing 401 is depicted as a portable housing of the type usable, for example, in a cellular telephone or personal digital assistant, and screen 410 is exposed at the surface of the housing. Where structure 406 includes a light-sensitive element such as an imaging chip, a lens 411 or other optical device also may be provided for routing light to the structure. Again, the simplified system shown in FIG. 8 is merely exemplary; other systems, including systems commonly regarded as fixed structures, such as desktop computers, routers and the like can be made using the structures discussed above.

The vias and via conductors disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of fabricating a microelectronic unit, comprising:
removing material from a substrate having a CTE less than 10 ppm/° C. to form a hole extending from a major surface of the substrate to a second surface opposite the major surface;
forming an electrically conductive element having a joining portion extending above and supported on the major surface, an anchor portion fixed relative to the substrate, and a connecting portion extending downwardly from the joining portion to the anchor portion, a surface of the connecting portion having a contour conforming to a contour of an inner surface of the hole;
removing material supporting at least a joining portion of the conductive element from the major surface to form a recess such that the joining portion at least partially overlies the recess, and such that the contour of the surface of the connecting portion does not conform to a contour of an inner surface of the recess; and
depositing a material within the recess having a modulus of elasticity less than 10 GPa,
wherein the joining portion is at least partially exposed at the major surface of the substrate for connection to a component external to the microelectronic unit.

2. The method as claimed in claim 1, wherein the substrate has a CTE less than 7 ppm/° C.

3. The method as claimed in claim 1, further comprising, before the step of forming the conductive element, forming a conductive via extending within the hole and extending towards the second surface, such that the step of forming the conductive element electrically couples the conductive element with the conductive via.

4. The method as claimed in claim 1, wherein the step of forming the conductive element is performed such that the joining portion is non-centered relative to the connecting portion.

5. The method as claimed in claim 1, wherein the step of forming the conductive element is performed such that the joining portion is disposed substantially parallel to the major surface.

6. The method as claimed in claim 1, wherein the substrate consists essentially of one material selected from the group consisting of: semiconductor, glass, and ceramic.

7. The method as claimed in claim 1, wherein the substrate includes a plurality of active semiconductor devices, and the step of forming the conductive element electrically connects the conductive element with at least one of the plurality of active semiconductor devices.

8. The method as claimed in claim 1, wherein the step of forming the conductive element is performed such that the joining portion defines an internal aperture.

9. The method as claimed in claim 8, wherein the step of forming the conductive element is performed such that the aperture extends through the joining portion into the connecting portion.

10. The method as claimed in claim 9, further comprising depositing a dielectric material into at least a portion of the aperture.

11. The method as claimed in claim 1, wherein the step of removing material from the substrate to form a hole includes forming a first opening extending from the major surface towards the second surface and a second opening extending from the first opening to the second surface, wherein inner surfaces of the first and second openings extend in first and second directions relative to the major surface, respectively, to define a substantial angle.

12. A method of fabricating a stacked assembly including at least first and second microelectronic units, the first microelectronic unit being fabricated as claimed in claim 1, further comprising the step of electrically connecting the substrate of the first microelectronic unit to a substrate of the second microelectronic unit.

* * * * *